United States Patent [19]
Ito et al.

[11] Patent Number: 5,514,425
[45] Date of Patent: May 7, 1996

[54] METHOD OF FORMING A THIN FILM

[75] Inventors: Hitoshi Ito; Kyoichi Suguro, both of Yokohama; Nobuo Hayasaka, Yokosuka; Haruo Okano, Tokyo; Shinji Himori; Kazuya Nagaseki, both of Yamanashi; Syuji Mochizuki, Koufu, all of Japan

[73] Assignees: Kabushiki Kaisha Toshiba, Kawasaki; Tokyo Electron Limited, Tokyo; Tokyo Electron Yamanashi Limited, Nirasaki, all of Japan; a part interest

[21] Appl. No.: 392,737
[22] PCT Filed: Jul. 5, 1994
[86] PCT No.: PCT/JP94/01089
§ 371 Date: Mar. 6, 1995
§ 102(e) Date: Mar. 6, 1995
[87] PCT Pub. No.: WO95/02076
PCT Pub. Date: Jan. 19, 1995

[30] Foreign Application Priority Data

Jul. 5, 1993 [JP] Japan .................. 5-165644

[51] Int. Cl.$^6$ .................. C23C 14/02
[52] U.S. Cl. .................. 427/534; 427/253; 427/255.2; 427/271; 427/275; 427/290; 427/294; 427/299; 427/333; 427/337; 427/552; 427/576

[58] Field of Search .................. 427/571, 576, 427/585, 250, 255.2, 292, 294, 534, 552, 253, 271, 275, 290, 299, 333, 337

[56] References Cited

PUBLICATIONS

J. Vac. Sci. Technol. B, vol. 10, No. 6, p. 2699, Y. Aoyagi, T. Hara, M. Hamagaki, M. Ryoji, K. Ohniszhi, Nov.–Dec. 1992 (in English).

Oyo Buturi, vol. 63 No. 6, p. 559, H. Sugai, Jun. 1994 (in Japanese).

*Primary Examiner*—Bernard Pianalto
*Attorney, Agent, or Firm*—Oblon, Spivak, McClelland, Maier & Neustadt

[57] ABSTRACT

A thin film-forming method according to the present invention is characterized by comprising the steps of introducing $TiCl_4$, hydrogen, nitrogen and $NF_3$ into a film-forming chamber containing a semiconductor substrate (1) having a groove made in its surface, after the chamber has been evacuated to $10^{-4}$ Torr or less; and converting these gases into plasma, thereby forming a thin TiN film on only that portion of the groove which is other than the wall surfaces of the groove.

22 Claims, 3 Drawing Sheets

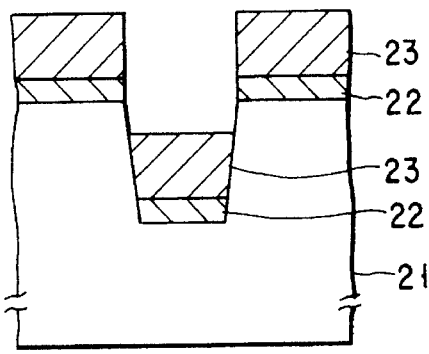
F I G. 4A
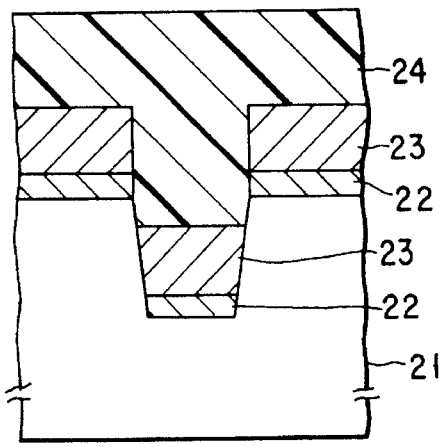
F I G. 4B
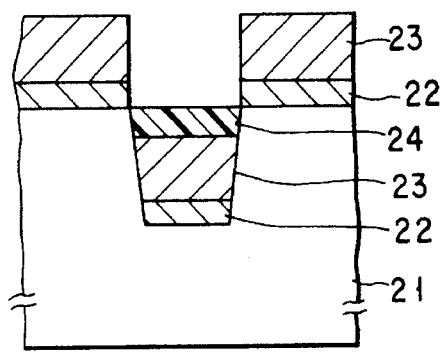
F I G. 4C
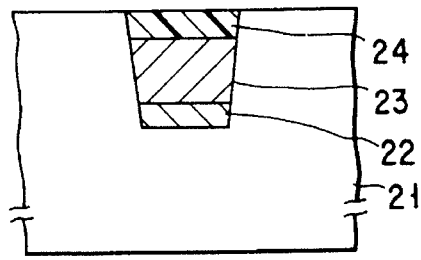
F I G. 4D
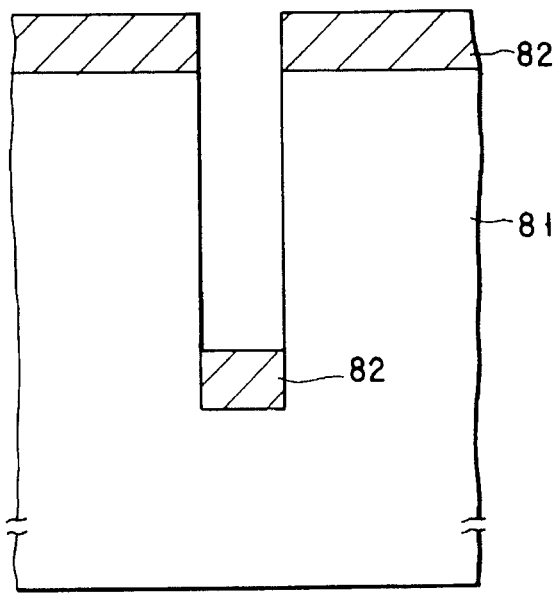
F I G. 5
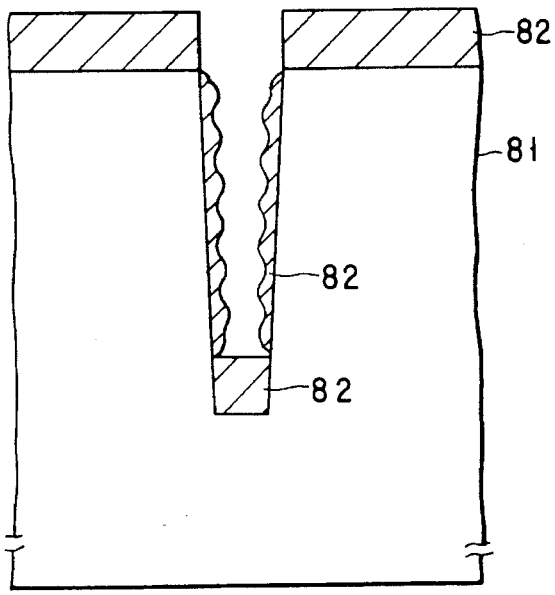
F I G. 6

METHOD OF FORMING A THIN FILM

TECHNICAL FIELD

The present invention relates to a method of forming a thin film, and more particularly to a method of forming a thin film by utilizing plasma.

BACKGROUND ART

In recent years, large-scale integrated circuits (LSIs), each comprising many transistors, many resistors and many similar elements connected, constituting an electric circuit, are incorporated in great numbers in the major components of computers or communication apparatuses.

The performance of an LSI can be enhanced by increasing its integration density, that is, by making its elements smaller. To make the elements smaller it is necessary to employ techniques of forming thin films in grooves having a large aspect ratio.

One of the techniques of forming thin films is the plasma CVD method in which a low-pressure plasma source is used. The plasma CVD method is attracting attention because the gases have long mean free path, providing reactive species which can propagate very linearly. Known as low-pressure plasma sources are EBEP (Electron Beam Excited Plasma), ECR (Electron Cyclotron Resonance) plasma, HELICON plasma and the like.

In the plasma CVD method using a low-pressure plasma source, a voltage is applied to a substrate being processed, so that ions of deposited species are positively drawn from the plasma to the substrate. A thin film 82 having a high directionality can thereby be formed in a groove formed in the substrate and having vertical wall surfaces.

If the groove such a tapered one as is shown in FIG. 6, a thin film 82 will be formed also on the wall surfaces of the groove. In this case, it is difficult to form a film having a high directionality.

As described above, the conventional plasma CVD method using a low-pressure plasma source has the problem that a film will be formed also on the wall surfaces of a tapered groove which has a high aspect ratio and which has tapered wall surfaces.

The present invention has been made in consideration of the above circumstances. Its object is to provide a method of forming a thin film in a groove made in a surface of a substrate 81 being processed, by applying a voltage to the substrate, thereby drawing ions of deposited species from plasma to the substrate, even if the groove is a tapered one having a high aspect ratio.

DISCLOSURE OF INVENTION

According to the present invention, there is provided a method of forming a thin film on a substrate which is processed and which has a groove in its surface, said method comprising the steps of: introducing a material gas containing a metallic substance and a halogen-based gas into a film-forming chamber in which the substrate is located; and converting a mixture gas of the halogen-based gas and the material gas into plasma, thereby to form a thin film anisotropically on the substrate being processed. The term "metallic substance" means not only a metal, but also a metal-containing substance such as an organic metal or a metal halide.

According to the present invention, there is provided a method of forming a thin film on a substrate which is processed and which has a groove in its surface, said method comprising the steps of: introducing a material gas containing a metallic substance into a film-forming chamber in which the substrate is located; converting the material gas into plasma, thereby forming a thin film on the substrate being processed; exciting a halogen-based gas by a plasma, and applying the halogen-based gas excited by the plasma to the substrate located in the chamber, thereby etching an entire surface of the thin film and leaving the thin film anisotropically on the substrate. In the method of forming a thin film, according to this invention, the cations of the metallic substance (i.e., material of the thin film), which have generated from the plasma, are transported to the bottom of the groove in a greater quantity than to the wall surfaces of the groove. The thin film formed on the wall surfaces of the groove are much thinner than the film form on the bottom of the groove.

The halogen-based gas is introduced into the film forming chamber, either simultaneously with the material gas or after the formation of the film. Hence, the thin film formed on the substrate being processed can be etched with neutral halogen or halogen radicals.

The thin film formed on the wall surfaces of the groove made in the substrate is first etched. This is because it is far thinner than the thin film formed on the bottom of the groove.

As a result, a thin film is formed on only that portion of the groove which is other than the wall surfaces.

BRIEF DESCRIPTION OF DRAWINGS

FIGS. 4A, 4B, 4C and 4D are sectional views for explaining the steps of a method of forming buried lines, which is a fourth embodiment of the invention.

FIG. 5 is a diagram for explaining a conventional method of forming a thin film.

FIG. 6 is a diagram for explaining the problem of the conventional thin film-forming method.

BEST MODE FOR CARRYING OUT THE INVENTION

The present invention will now be described in detail, with reference to the accompanying drawings.

First, a semiconductor substrate having a tapered groove made in its surface had having a high aspect ratio is mounted on a sample table arranged in a film-forming chamber. The groove has a depth of 3 to 4 μm and a width of about 0.5 to 1.0 μm. The film-forming chamber is connected to the ground, and a predetermined bias is applied to the sample table.

After the film-forming chamber is evacuated to $10^{-6}$ Torr or less, a mixture gas of $TiCl_4$, hydrogen, nitrogen and $NF_3$ was introduced into the film-forming chamber. $TiCl_4$ was introduced at flow rate of about 0.1 to 1.0 SCCM, hydrogen at flow rate of about 30 to 50 SCCM, nitrogen at flow rate of about 10 to 50 SCCM, and $NF_3$ at flow rate of about 0.1 to 5 SCCM. The evacuation rate is adjusted, thereby maintaining the pressure within the film-forming chamber at about 0.1 to 0.5 mTorr.

Figure 1:
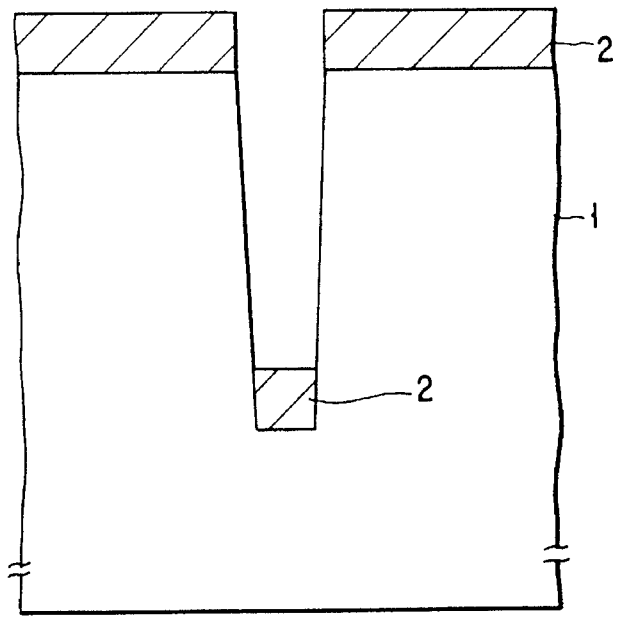
FIG. 1 is a sectional view, showing the shape of a TiN film formed by a TiN film-forming method according to a first embodiment of the present invention.

Next, a bias voltage of −70 to −100V is applied to the sample table, converting the mixture gas into plasma. The semiconductor substrate 1 is thereby heated, preferably to 200° C. to 800° C. As a result of this, a thin TiN film 2 is formed, as shown in FIG. 1, on only that portion of the groove which is other than the wall surfaces. The thin TiN film 2 may be formed at normal temperature, instead.

Why the thin TiN film 2 can be so formed by this method will be studied.

In the present embodiment, cations of Ti or the like, which is the film material existing in the plasma, are preferentially transported to that portion of the groove made in the semiconductor substrate 1, which is other than the wall surfaces while the film is being formed.

At this time, the mixture gas has already been converted into plasma under a low pressure of 0.1 to 0.5 mTorr ($10^{-4}$ Torr or less). The frequency at which gas particles collide with one another is therefore sufficiently low.

Hence, the cations are scarcely influenced by the scattering of the gas particles and moved basically along the electric field generated by the bias voltage applied to the sample table. The thin TiN film formed on the wall surfaces of the groove made in the semiconductor substrate is much thinner than the film formed on any other part of the groove.

The mixture gas contains halogen-based gases, i.e., $TiCl_4$ and $NF_3$. As the mixture gas is converted into plasma, Cl radicals and F radicals or neutral Cl and neutral F will be generated. These etching species almost uniformly etch the thin TiN film formed on the semiconductor substrate.

As indicated above, the thin TiN film formed on the wall surfaces of the groove made in the semiconductor substrate is far thinner than the film formed on any other part of the groove.

It follows that the thin TiN film 2 is formed, as shown in FIG. 1, on only that portion of the groove made in the substrate 1, which is other than the wall surfaces.

Figure 2A:
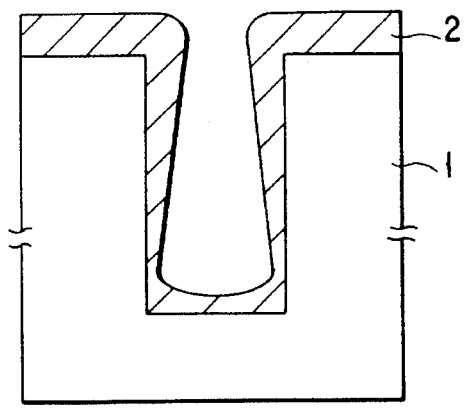
FIGS. 2A, 2B and 2C are sectional views showing how the shape of the film depends on the bias applied on the substrate.
Figure 2B:
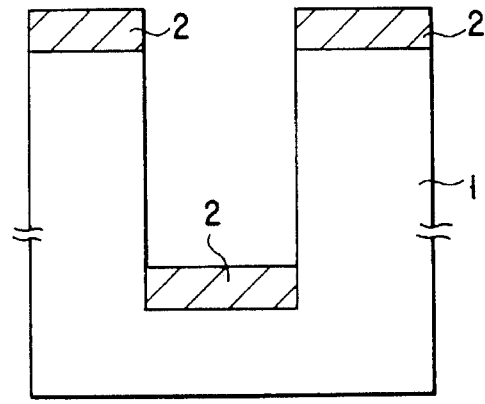
Figure 2C:
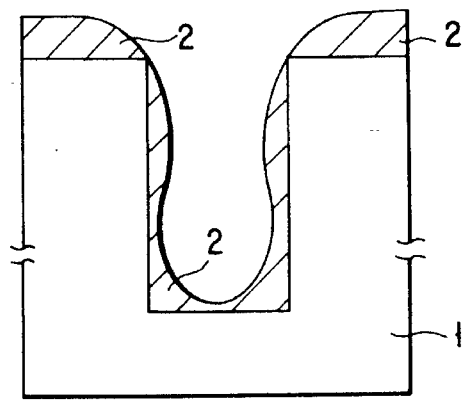

FIGS. 2A to FIG. 2C are views showing how the shape of the film depends on the bias applied on the substrate, when the film is formed by introducing $TiCl_4$, hydrogen, nitrogen and $NF_3$. When the bias voltage is as low as about −20V, ions cannot achieve a sufficiently linear propagation. In this case, the advantage of the present invention cannot be attained, as may be understood from FIG. 2A. When the bias voltage is about −150V, a part of the metal film already deposited is sputtered due to the momentum the ions have acquired, and again adhere to the wall surfaces of the groove. Consequently, the thin TiN film does not have an anisotropic shape as can be seen from FIG. 2C. When the bias voltage is about −80V, the thin TiN film has an anisotropic shape as is shown in FIG. 2B. The results of the experiment, in which various bias voltages were applied, show that the advantage of the present invention is best attained when the bias voltage ranges from −70 to −100V.

In the present embodiment, as described above, the gases to become film material and etching species are simultaneously into the film-forming chamber, consequently generating plasma. A thin TiN film can therefore be formed on only that portion of the groove made in the substrate 1, which is other than the wall surfaces.

The mixture gas specified above may be replaced by a mixture of $Ti[N(C_2H_5)_2]_2$ or $Ti[N(CH_3)_2]_4$, used as gas and supplied at flow rate of 10 to 50 SCCM, hydrogen supplied at flow rate of 10 to 100 SCCM, and $NF_3$ supplied at flow rate of 0.1 to 5 SCCM. In this case, as well, a thin TiN film can be formed on only that portion of the groove which is other than the wall surfaces, provided that the film-forming conditions, e.g., the temperature, the bias voltage and the like, are the same as described above.

To form a thin W film, instead of a thin TiN film, $WF_6$ used as carrier gas, hydrogen and $NF_3$, for example, may be used in place of the gases specified above and supplied at a flow rate of 5 to 10 SCCM, a flow rate of 10 to 30 SCCM and a flow rate of 0.1 to 5 SCCM, respectively. In this case it is desirable that the sample be heated to 600° C. or more by applying a bias voltage similar to that applied in the embodiment described above.

To form a thin $TiSi_2$ film, instead of a thin TiN film, $TiCl_4$, $SiCl_4$, hydrogen and $NF_3$, for example, may be used in place of the gases specified above and supplied at a flow rate of 0.5 to 1.0 SCCM, a flow rate of 1.0 to 10 SCCM, a flow rate of 10 to 1000 SCCM and a flow rate of 0.1 to 5 SCCM, respectively.

Other gases may be used to form a thin $TiSi_2$ film. For instance, a mixture $TiCl_4$, $SiH_4$ and $NF_3$ may be used, the three component gases being supplied at a flow rate of 0.5 to 1.0 SCCM, a flow rate of 0.1 to 100 SCCM and a flow rate of 0.1 to 5 SCCM, respectively.

In both cases mentioned above, where a TiSi2 film is formed, it is desirable that the bias voltage and the temperature be set at the same values as applied to form a thin TiN film.

A method of forming a TiN film, according to a second embodiment of the present invention, will be described below.

First, a semiconductor substrate having a groove made in its surface is mounted on a sample table arranged in a film-forming chamber. A predetermined bias is applied to the sample table, as in the embodiment described above.

Then, $TiCl_4$, hydrogen and nitrogen are introduced into the film-forming chamber at a flow rate of about 0.1 to 1.0 SCCM, a flow rate of about 30 to 50 SCCM and a flow rate of about 10 to 50 SCCM, respectively. At this time, the rate of evacuating the chamber is adjusted, maintaining the pressure in the film-forming chamber at about 0.1 to 0.5 mTorr.

Next, a bias voltage of about −70 to −100V is applied to the sample table, thereby converting the gases into plasma and forming a thin TiN film on the semiconductor substrate as in the first embodiment. The thin TiN film formed on the wall surfaces of the groove made in the semiconductor substrate is far thinner than the TiN film formed on any other part of the groove, for the same reason as applied to the first embodiment.

Further, $CF_4$ is introduced into the film-forming chamber at a flow rate of 10 to 50 SCCM, together with a halogen-based gas. The rate of evacuating the chamber is adjusted, thus maintaining the pressure in the film-forming chamber at 1 to 5 mTorr. Then, $CF_4$ is converted into plasma, thereby etching the TiN film. The TiN film formed on the wall surfaces of the groove made in the semiconductor substrate is first etched since it is relatively thin.

In this film-forming method, a thin TiN film can be formed, as in the method according to the first embodiment, on only that portion of the groove which is other than the wall surfaces, even if the groove is a tapered one having a high aspect ratio.

The second method is advantageous over the first embodiment in that damage to the semiconductor substrate is reduced since the TiN film is etched after the formation of the TiN film, whereas the TiN film is formed and etched at the same time.

Furthermore, a method of exciting the halogen-based gas for etching is not limited to the above-mentioned reactive ion etching. For example, the halogen-based gas may be excited in an excitation section provided within the chamber, remote from the semiconductor substrate placed in the film-growing chamber, or may be excited by a plasma-exciting means provided outside the film-forming chamber. The gas, thus excited, may be supplied, in down-flow scheme, to the substrate being processed, such as a semiconductor substrate.

Alternatively, after the TiN film has been formed, the substrate may be transferred into the etching chamber of a down-flow etching apparatus or a reactive ion etching apparatus, and the TiN film may then be etched.

A method according to a third embodiment of the invention, in which a thin TiN film is formed by means of lift-off technique, will be described below.

Figure 3A:
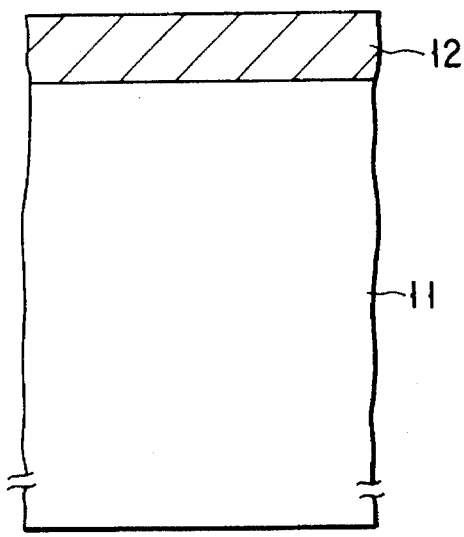
FIGS. 3A, 3B, 3C and 3D are sectional views for explaining the steps of a method according to a third embodiment of the invention, in which a thin TiN film is formed by means of lift-off technique.

First, as shown in FIG. 3A, a thin Al film 12, about 100 to 500 nm thick, is formed on a silicon substrate 11.

Figure 3B:
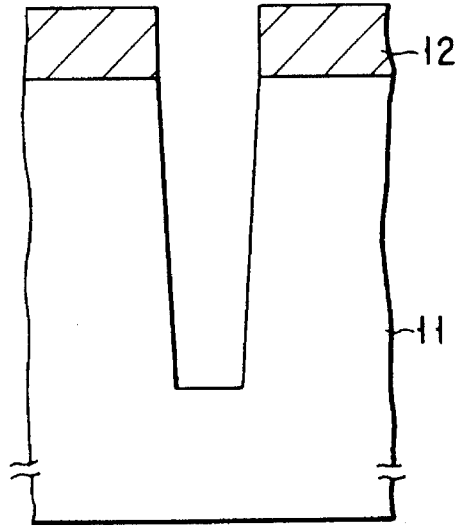

Next, a photoresist pattern (not shown) is formed on the thin Al film 12 in preparation for forming a groove. Using the photoresist pattern as a mask, the silicon substrate 11 and the thin Al film 12 are etched, thereby forming a groove of a high aspect ratio in the surface of the silicon substrate 11 as illustrated in FIG. 3B.

Figure 3C:
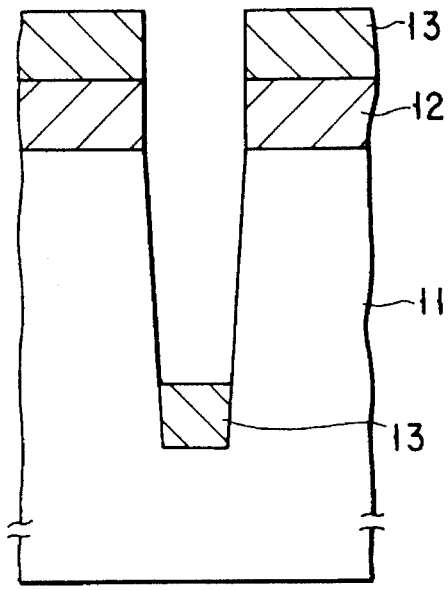

Then, as shown in FIG. 3C, a thin TiN film 13 is formed on only that portion of the groove which is other than the wall surfaces of the groove, in the same way as in the first or second embodiment described above.

Figure 3D:
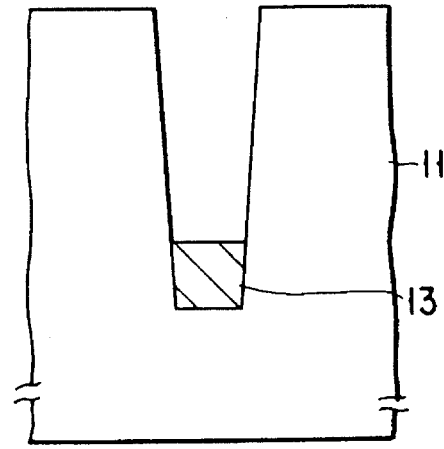

Finally, the silicon substrate 11 is immersed in a solution of sulfuric acid. Although Al is dissolved, TiN is scarcely dissolved. Therefore, as shown in FIG. 3D, the thin TiN film 13 is removed, except that part formed on the bottom of the groove. As a result, the thin TiN film 13 is left, on only the bottom of the groove.

Thus, in the present embodiment, the photoresist pattern is used as a mask, and a thin TiN film 13 can be formed on only the bottom of the groove, without etching the thin TiN film 13.

A method according to a fourth embodiment of the invention, which is a method of forming buried lines, will now be described.

First, as shown in FIG. 4A, a thin TiN film 22 and a Cu film 23, both about 50 nm thick, are sequentially formed in the same way as in the first and second embodiments, on a silicon substrate 21 having a tapered groove of a high aspect ratio.

The thin Cu film 23 has been formed by using gases such as $Cu(DPM)_2$ and $H_2$ and by setting the bias voltage and the temperature at values similar to those applied in forming the thin TiN film.

Next, as shown in FIG. 4B, a photoresist 24 is coated on the entire surface of the resultant structure, completely covering the thin Cu film 23. The photoresist 24 may be replaced by an $SiO_2$ film, as will be described later.

Then, the photoresist 24 is etched by means of reactive ion etching such that, as shown in FIG. 4C, the thin TiN film 22 and the thin Cu film 23, both located outside the groove are exposed, whereas the thin Cu film 23 located at the bottom of the groove is not exposed.

Thereafter, the silicon substrate 21 is immersed in $H_2SO_4$, removing the thin Cu film 23 not masked by the photoresist 24. Further, $H_2O_2$ is applied, thereby removing a part of the thin TiN film 22.

Finally, the photoresist 24 in the groove is removed, thereby forming a layered buried line which is comprised of the thin TiN film 22 and the thin Cu film 23.

In the method described above, a buried line can be formed in a tapered groove having a high aspect ratio, without patterning the thin TiN film 22 and the thin Cu film 23 by means of photolithography.

The photoresist 24 is used in the present embodiment. Instead, an $SiO_2$ film may be used. If this is the case, the $SiO_2$ is one formed by using, for example, TEOS and $O_3$. As materials of the thin Cu film, $Cu(HFA)_2$ and $H_2$ are used.

The present invention is not limited to the embodiments described above. For instance, the halogen-based gas for etching is not limited to $NF_3$ and $CF_4$ used in the above embodiments; other halogen-based gases, such as $NF_3$ and $Cl_2$ may be used instead. Furthermore, various modifications can be made without departing from the scope of the present invention.

INDUSTRIAL APPICABILITY

As has been described in detail, a thin film can be formed on the bottom of a groove, leaving no thin film on the wall surfaces of the groove, even if the groove is a tapered one which has a high aspect ratio.

We claim:

1. A method of forming a thin film on a substrate, said method comprising the steps of:
   introducing a material gas containing a metallic substance and a halogen-based gas into a film-forming chamber containing a substrate, said substrate having a groove on its surface; and
   converting a mixture gas of the halogen-based gas and the material gas into plasma, thereby to form a thin film anisotropically on the substrate being processed.

2. The method of forming a thin film, according to claim 1, characterized in that the mixture gas is converted into plasma at a pressure of at most $10^{-4}$ Torr.

3. The method of forming a thin film, according to claim 1, characterized in that a thin film is formed by applying a voltage of $-70$ to $-100$V to the substrate being processed.

4. The method of forming a thin film, according to claim 1, characterized in that the plasma converted from the mixture gas is EBEP (Electron Beam Excited Plasma), ECR (Electron Cyclotron Resonance) plasma or HELICON plasma.

5. The method of forming a thin film, according to claim 1, characterized in that the halogen-based gas is at least one selected from the group consisting of $NF_3$ gas, $CF_4$ gas, $F_2$ gas and $Cl_2$ gas.

6. The method of forming a thin film, according to claim 1, characterized in that the thin film is a thin TiN film.

7. The method of forming a thin film, according to claim 1, characterized in that the mixture gas contains $TiCl_4$ gas, hydrogen gas, nitrogen gas and $NF_3$ gas.

8. The method of forming a thin film, according to claim 1, characterized in that the thin film is a thin Cu film.

9. The method of forming a thin film, according to claim 8, characterized in that a material gas for Cu contains $Cu(DPM)_2$ gas and $H_2$ gas.

10. A method of forming a thin film on a substrate, said method comprising the steps of:

introducing a material gas containing a metallic substance and a halogen-based gas into a film-forming chamber containing a substrate, said substrate having a groove on its surface; and converting a mixture gas of the halogen-based gas and the material gas into plasma, thereby to form a thin film selectively on a surface portion of the substrate which is other than the groove, and on a bottom portion of the groove.

11. A method of forming a thin film on a substrate, said method comprising the steps of:

introducing a material gas containing a metallic substance into a film-forming chamber containing a substrate, said substrate having a groove on its surface;

converting the material gas into plasma, thereby forming a thin film on the substrate being processed;

exciting a halogen-based gas by a plasma; and applying the halogen-based gas excited by the plasma to the substrate located in the chamber, thereby etching an entire surface of the thin film and leaving the thin film anisotropically on the substrate.

12. The method of forming a thin film, according to claim 11, characterized in that the mixture gas is converted into plasma at a pressure of at most $10^{-4}$ Torr.

13. The method of forming a thin film, according to claim 11, characterized in that a thin film is formed by applying a voltage of −70 to −100V to the substrate being processed.

14. The method of forming a thin film, according to claim 11, characterized in that the plasma converted from the mixture gas is EBEP (Electron Beam Excited Plasma), ECR (Electron Cyclotron Resonance) plasma or HELICON plasma.

15. The method of forming a thin film, according to claim 11, characterized in that the halogen-based gas is excited by the plasma, outside the film-forming chamber, and is applied to the substrate in a down-flow scheme.

16. The method of forming a thin film, according to claim 11, characterized in that the halogen-based gas is at least one selected from the group consisting of $NF_3$ gas, $CF_4$ gas, $F_2$ gas and $Cl_2$ gas.

17. The method of forming a thin film, according to claim 11, characterized in that the thin film is a thin TiN film.

18. The method of forming a thin film, according to claim 17, characterized in that the mixture gas contains $TiCl_4$ gas, hydrogen gas, nitrogen gas and $NF_3$ gas.

19. The method of forming a thin film, according to claim 11, characterized in that the thin film is a thin Cu film.

20. The method of forming a thin film, according to claim 19, characterized in that a material gas for Cu contains $Cu(DPM)_2$ gas and $H_2$ gas.

21. A method of forming a thin film on a substrate, said method comprising the steps of:

introducing a material gas containing a metallic substance into a film-forming chamber containing a substrate, said substrate having a groove on its surface;

converting the material gas into plasma, thereby forming a thin film on the substrate;

exciting a halogen-based gas by a plasma; and applying the halogen-based gas excited by the plasma to the substrate located in the chamber, thereby etching an entire surface of the thin film and leaving the thin film selectively on a surface portion of the substrate which is other than the groove, and on a bottom portion of the groove.

22. The method of forming a thin film, according to claim 21, characterized by further comprising the step of removing the thin film, from only a region of the substrate which is other than the groove.

* * * * *